US012112922B2

(12) United States Patent
Kiyosue et al.

(10) Patent No.: US 12,112,922 B2
(45) Date of Patent: Oct. 8, 2024

(54) PLASMA TREATMENT APPARATUS

(71) Applicant: Hitachi High-Tech Corporation, Tokyo (JP)

(72) Inventors: Kentaro Kiyosue, Tokyo (JP); Kohei Sato, Tokyo (JP); Ryoichi Isomura, Tokyo (JP); Koji Nagai, Tokyo (JP); Tsutomu Matsuyoshi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/641,886

(22) PCT Filed: May 27, 2021

(86) PCT No.: PCT/JP2021/020226
§ 371 (c)(1),
(2) Date: Dec. 1, 2022

(87) PCT Pub. No.: WO2022/249398
PCT Pub. Date: Dec. 1, 2022

(65) Prior Publication Data
US 2024/0047179 A1 Feb. 8, 2024

(51) Int. Cl.
*H01J 37/32* (2006.01)
*H05H 1/46* (2006.01)

(52) U.S. Cl.
CPC .............................. *H01J 37/32449* (2013.01)

(58) Field of Classification Search
CPC .. H05H 1/46; H01J 37/32449; H01J 37/3244; H01J 2237/334; H01J 2237/3321; H01J 37/32091
See application file for complete search history.

(56) References Cited

U.S. PATENT DOCUMENTS

| 6,815,362 B1 | 11/2004 | Wong et al. |
| 7,204,913 B1 | 4/2007 | Singh et al. |

(Continued)

FOREIGN PATENT DOCUMENTS

| JP | H0542990 A | 2/1993 |
| JP | H0948690 A | 2/1997 |

(Continued)

OTHER PUBLICATIONS

Office Action mailed Nov. 22, 2022 in Taiwanese Application No. 11106138.

(Continued)

*Primary Examiner* — Wei (Victor) Y Chan
(74) *Attorney, Agent, or Firm* — Miles & Stockbridge, P.C.

(57) ABSTRACT

A plasma treatment apparatus includes a treatment chamber 2 and a gas supply device 30 for supplying a treatment gas into the treatment chamber 2. The gas supply device 30 includes: a mass flow controller box 40 having an intake port 41 and an exhaust port 42; a plurality of pipes 43 to each of which a mass flow controller (43a) is attached; and a plurality of pipes 52 which are connected to the pipes 43 in the mass flow controller box 40 and connected to a plurality of pipes 54 as supply sources of the treatment gas by a plurality of joints 53 outside the mass flow controller box. At least one of the joints 53 is covered by a pipe cover 60 so that the joint 53 is hermetically sealed. The inside of the pipe cover 60 and the inside of the mass flow controller box 40 are communicated by a communicating member (circumferential pipe 61, tube 62).

9 Claims, 7 Drawing Sheets

(56) References Cited

U.S. PATENT DOCUMENTS

| | | | |
|---|---|---|---|
| 8,557,709 | B2 | 10/2013 | Sumiya et al. |
| 8,767,166 | B2 | 7/2014 | Kubota et al. |
| 8,877,472 | B2 | 11/2014 | Medoff |
| 9,090,972 | B2 | 7/2015 | Shareef et al. |
| 9,721,763 | B2 | 8/2017 | Shareef et al. |
| 2003/0005943 | A1 | 1/2003 | Singh et al. |
| 2004/0014327 | A1 | 1/2004 | Ji et al. |
| 2004/0235303 | A1 | 11/2004 | Wong et al. |
| 2009/0120363 | A1* | 5/2009 | Koishi ............... C23C 16/45578 118/715 |
| 2009/0152242 | A1* | 6/2009 | Sato ................... H01J 37/32834 156/345.24 |
| 2011/0114130 | A1 | 5/2011 | Kang et al. |
| 2011/0265813 | A1 | 11/2011 | Okai et al. |
| 2012/0037596 | A1* | 2/2012 | Eto ................... H01J 37/32495 427/427 |
| 2012/0100309 | A1* | 4/2012 | Miyairi ............... H01J 37/3244 118/712 |
| 2013/0087174 | A1 | 4/2013 | Sun et al. |
| 2014/0166049 | A1 | 6/2014 | Kang et al. |
| 2017/0194561 | A1 | 7/2017 | Suyama et al. |
| 2018/0082855 | A1 | 3/2018 | Sasaki et al. |
| 2018/0337103 | A1* | 11/2018 | Omori ............... H01L 21/67017 |
| 2022/0010430 | A1* | 1/2022 | Hayashi ............ H01J 37/32357 |

FOREIGN PATENT DOCUMENTS

| | | | |
|---|---|---|---|
| JP | 2000150387 | A | 5/2000 |
| JP | 2008060171 | A | 3/2008 |
| JP | 2011192872 | A | 9/2011 |
| JP | 2018046216 | A | 3/2018 |
| KR | 10-2011-0054287 | A | 5/2011 |
| TW | 504102 | A | 9/2002 |
| TW | 200402458 | A | 2/2004 |
| TW | 201207520 | A | 2/2012 |
| TW | 201717277 | A | 5/2017 |
| TW | I609444 | B | 12/2017 |

OTHER PUBLICATIONS

Search Report mailed Aug. 3, 2021 in International Application No. PCT/JP2021/020226.
Written Opinion mailed Aug. 3, 2021 in International Application No. PCT/JP2021/020226.
Office Action mailed Feb. 9, 2018 in Korean Application No. 10-2017-0004059.
Office Action mailed Oct. 3, 2017 in Taiwanese Application No. 106102963.
Office Action mailed Nov. 29, 2021 in U.S. Appl. No. 15/443,578.
Office Action mailed May 18, 2021 in U.S. Appl. No. 15/443,578.
Office Action mailed Oct. 1, 2020 in U.S. Appl. No. 15/443,578.
Office Action mailed Mar. 12, 2020 in U.S. Appl. No. 15/443,578.
Office Action mailed Jun. 6, 2019 in U.S. Appl. No. 15/443,578.
Office Action mailed Nov. 26, 2018 in U.S. Appl. No. 15/443,578.
Office Action mailed Apr. 3, 2018 in U.S. Appl. No. 15/443,578.
Office Action mailed Nov. 29, 2017 in U.S. Appl. No. 15/443,578.
Office Action mailed Jul. 25, 2022 in U.S. Appl. No. 15/443,578.

* cited by examiner

PLASMA TREATMENT APPARATUS

TECHNICAL FIELD

The present invention relates to a plasma treatment apparatus and more particularly to a plasma treatment apparatus with a gas supply device for supplying a treatment gas into a treatment chamber.

BACKGROUND ART

In the recent years, in the semiconductor chip manufacturing process, plasma treatment has been performed on the surface of a semiconductor wafer using a plasma treatment apparatus. For example, Patent Literature 1 discloses a method in which, after plasma-cleaning the inside of the treatment chamber of a plasma treatment apparatus using a gas containing elemental fluorine, a deposited film is made in the treatment chamber by plasma using a gas containing elemental silicon and then plasma etching is performed on the semiconductor wafer as the subject material to be treated.

CITATION LIST

Patent Literature

PTL 1: Japanese Unexamined Patent Application Publication No. 2018-046216

SUMMARY OF INVENTION

Technical Problem

As disclosed in Patent Literature 1, in the recent years, a process that uses a low vapor pressure gas such as $SiCl_4$ or $BCl_3$ has been realized. When a flammable low vapor pressure gas like this is introduced into the treatment chamber, there is a need for a supply means that keeps the low vapor pressure gas at high temperature and also suppresses gas leakage to the area around the plasma treatment apparatus.

In the prior art, in a building in which the plasma treatment apparatus is installed, a plurality of pipes for supplying several types of gas from gas supply sources are connected to a mass flow controller box provided in the plasma treatment apparatus and the gases are supplied into the treatment chamber through pipes for treatment gases that extend from the mass flow controller box. In addition, the plurality of pipes from the gas supply sources in the building are connected to gas pipe connection boxes located under the floor on which the plasma treatment apparatus is installed in the building and in the connection boxes, the pipes are connected to the mass flow controller box and connected to a plurality of gas supplying pipes extending downward, in an attachable and detachable manner. The inside of each box is connected to an exhaust mechanism such an exhaust pipe to discharge the gas in the box, thereby preventing gas leakage into the inside of the building even if gas leakage from a gas pipe connection occurs.

On the other hand, in order to reduce the operating cost of the plasma treatment apparatus in connection with exhaust ventilation to suppress diffusion of leaked gas as mentioned above, there is a need to eliminate the gas pipe connection box or exhaust ventilation in it. However, if the gas pipe connection box or the mechanism to discharge the air in it is merely stopped or eliminated, in case that gas leakage occurs from the connection between a gas pipe from the building and a pipe connected to the mass flow controller box on the plasma treatment apparatus side, the gas leaked in the building might easily diffuse. Therefore, a plasma treatment apparatus with a gas supply device that can prevent such leakage or diffusion of gas is expected.

Other issues and novel features will become apparent from the description in the specification and the accompanying drawings.

Solution to Problem

A representative one among the embodiments disclosed in the present application is briefly outlined as follows.

A plasma treatment apparatus according to an embodiment includes a treatment chamber and a gas supply device for supplying a treatment gas into the treatment chamber. The gas supply device includes: a mass flow controller box having an intake port and an exhaust port; a plurality of first pipes which are located in the mass flow controller box and to each of which a mass flow controller is attached; and a plurality of second pipes which are connected to the plurality of first pipes in the mass flow controller box and connected to a plurality of third pipes as supply sources of the treatment gas by a plurality of first joints outside the mass flow controller box. Here, at least one of the first joints is covered by a first pipe cover so that the first joint is hermetically sealed, and the inside of the first pipe cover and the inside of the mass flow controller box are communicated by a first communicating member.

Advantageous Effects of Invention

According to an embodiment, it is possible to provide a plasma treatment apparatus with a gas supply device that can reduce the operating cost of the plasma treatment apparatus and also prevent gas leakage.

DESCRIPTION OF EMBODIMENTS

Hereinafter, an embodiment will be described in detail referring to drawings. In all the drawings that illustrate the embodiment, elements with the same functions are designated by the same reference signs and repeated description thereof is omitted. Regarding the embodiment described below, basically descriptions of the same or similar elements are not repeated except when necessary.

First Embodiment

<Structure of the Plasma Treatment Apparatus>

Figure 1:
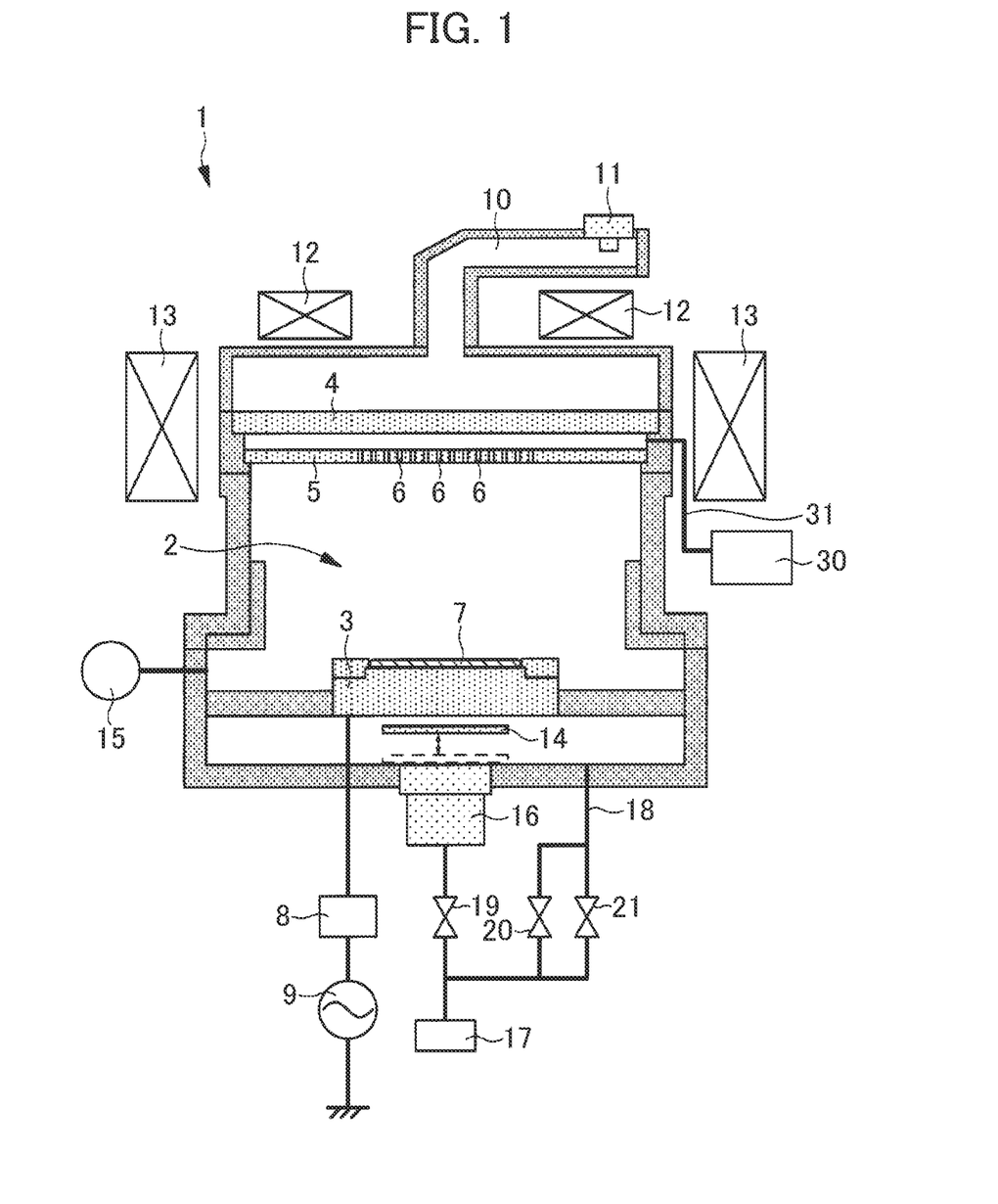
FIG. 1 is a schematic diagram that shows a plasma treatment apparatus according to a first embodiment.

Next, a plasma treatment apparatus 1 according to the first embodiment will be summarized referring to FIG. 1.

The plasma treatment apparatus 1 includes a treatment chamber 2 as a cylindrical vacuum container and a stage 3 located in the treatment chamber 2. A window member 4 in the shape of a disk and a plate 5 in the shape of a disk are located above the stage 3. The window member 4 is made of, for example, a dielectric material such as quartz or ceramics and airtightly seals the inside of the treatment chamber 2. The plate 5 is located under the window member 4 in a manner to be spaced from the window member 4 and made of, for example, a dielectric material such as quartz. The plate 5 has a plurality of through holes 6.

The stage 3 is used to place the subject material 7 to be treated in order to perform plasma treatment of the subject material 7. The subject material 7 is a wafer made of a semiconductor material such as silicon. The space between the stage 3 and the bottom of the treatment chamber 2 is communicated with the space above the stage 3 through the gaps between the side walls of the stage 3 and the side faces of the treatment chamber 2. Plasma or gas particles, a product that is generated during treatment of the subject material 7 placed on the stage 3, are discharged to the outside of the treatment chamber 2 through the space between the stage 3 and the bottom of the treatment chamber 2.

Although not illustrated in detail, the stage 3 has a cylindrical metallic base material. The upper surface of the base material is covered by a dielectric film. A heater is provided in the dielectric film and a plurality of electrodes are provided above the heater. DC voltage is supplied to the electrodes. The DC voltage can generate the electrostatic force to make the subject material 7 stick fast to the upper surface of the dielectric film and hold the subject material 7, in the dielectric c film and the subject material 7.

Furthermore, the stage 3 includes refrigerant flow paths multiply arranged multiply in a concentrical or spiral manner. In addition, with the subject material 7 placed on the upper surface of the dielectric film, a thermally conductive gas such as He is supplied to the gap between the lower surface of the subject material 7 and the upper surface of the dielectric film. Therefore, pipes in which the gas flows are provided in the base material and dielectric film.

The plasma treatment apparatus 1 also includes an impedance matching box 8 and a high frequency power source 9. The base material is connected to the high frequency power source 9 through the impedance matching box 8. During plasma treatment of the subject material 7, the high frequency power source 9 supplies high frequency power to the base material in order to generate an electric field to guide the charged particles in the plasma to the upper surface of the subject material 7.

The plasma treatment apparatus 1 also includes a pipe 31 and a gas supply device 30. The gas supply device 30 is connected to the treatment chamber 2 through the pipe 31. Gas is supplied from the gas supply device 30 to the space between the window member 4 and the plate 5 through the pipe 31 and diffused in the space. The diffused gas is supplied through the through holes 6 to above the stage 3.

The main feature of the present application is the structure of the gas supply device 30 and the feature will be described in detail later.

The plasma treatment apparatus 1 also includes a waveguide 10, a magnetron oscillator 11, and a solenoid coil 12 and a solenoid coil 13. The waveguide 10 is located above the window member 4 and the magnetron oscillator 11 is located at one end of the waveguide 10. The magnetron oscillator 11 can oscillate and output an electric field of microwaves. The waveguide 10 is a conduit line to propagate the electric field of microwaves. The electric field of microwaves is supplied into the treatment chamber 2 through the waveguide 10. The solenoid coil 12 and solenoid coil 13 are located around the waveguide 10 and the treatment chamber 2 and used as magnetic field generating means.

The plasma treatment apparatus 1 also includes a pressure adjusting plate 14, a pressure detector 15, a turbo-molecular pump 16 as a high vacuum pump, a dry pump 17 as a roughing pump, an exhaust pipe 18, and valves 19 to 21. The space between the stage 3 and the bottom of the treatment chamber 2 functions as a vacuum exhaust ventilation part. The pressure adjusting plate 14 is a valve in the shape of a disk and as it moves up and down above an exhaust port, the area of the flow path for the gas to flow into the exhaust port increases or decreases. In other words, the pressure adjusting plate 14 also performs the function as a valve that opens and closes the exhaust port.

The pressure detector 15 is a sensor to detect the internal pressure of the treatment chamber 2. A signal from the pressure detector 15 is transmitted to a controller (not shown) and the controller detects the pressure value and an instruction signal is sent from the controller according to the detected value. According to the instruction signal, the pressure adjusting plate 14 is driven and the position of the pressure adjusting plate 14 in the vertical direction is changed and the area of the flow path for exhaust air is increased or decreased.

The outlet of the turbo-molecular pump 16 is connected to the dry pump 17 through an exhaust pipe and the valve 19 is located at a midway point on the exhaust pipe. The space between the stage 3 and the bottom of the treatment chamber 2 is connected to the exhaust pipe 18, and the exhaust pipe 18 is provided with the valve 20 and valve 21. The valve 20 is a valve for slow exhaust ventilation that discharges the exhaust air at low speed by the dry pump 17 so that the treatment chamber 2 changes from the atmospheric pressure to a vacuum state. The valve 21 is a main valve for exhaust ventilation to discharge the exhaust air at high speed by the turbo-molecular pump 16.

Next, a case that an etching process using plasma is performed on a given film formed previously on the upper surface of the subject material 7 will be explained as an example.

The subject material 7 is put on the tip of the arm of a vacuum transport device, such as a robot arm, from outside the plasma treatment apparatus 1 and transported into the treatment chamber 2 and placed on the stage 3. As the arm of the vacuum transport device moves out of the treatment chamber 2, the inside of the treatment chamber 2 is hermetically sealed. DC voltage is applied to the electrodes for electrostatic adsorption inside the dielectric film of the stage 3 and the generated electrostatic force holds the subject material 7 on the dielectric film.

In this state, a thermally conductive gas such as He is supplied to the gap between the subject material 7 and the dielectric film through a pipe in the stage 3. A refrigerant whose temperature is adjusted to a specified temperature by a refrigerant temperature adjuster (not shown) is supplied to a refrigerant flow path in the stage 3. This accelerates heat transfer between the temperature-adjusted base material and the subject material 7 and the temperature of the subject material 7 is adjusted to a value within a range suitable for start of plasma treatment.

The treatment gas whose flow rate and velocity have been adjusted by the gas supply device 30 is supplied into the treatment chamber 2 through the pipe 31 and the air in the treatment chamber 2 is discharged through the exhaust port by operation of the turbo-molecular pump 16. The pressure in the treatment chamber 2 is adjusted to a value within a range suitable for plasma treatment by balancing between both.

In this state, the magnetron oscillator 11 generates an electric field of microwaves. The electric field of microwaves propagates in the waveguide 10 and passes through the window member 4 and plate 5. Furthermore, the magnetic field generated by the solenoid coil 12 and solenoid coil 13 is supplied to the treatment chamber 2. Interaction between the magnetic field and the electric field of microwaves causes electron cyclotron resonance (ECR), which leads to excitation, ionization or disassociation of atoms or molecules of the treatment gas, thereby generating plasma in the treatment chamber 2.

As the plasma is generated, high frequency power is supplied from the high frequency power source 9 to the base material of the stage 3 and a bias potential is produced on the upper surface of the subject material 7, so that charged particles such as ions in the plasma are brought to the upper surface of the subject material 7. Consequently, an etching process is performed on the specified film of the subject material 7 in a manner to suit the pattern form of a mask layer. After that, when it is detected that the treatment of the film as the object of treatment has reached its end point, the supply of the high frequency power from the high frequency power source 9 is stopped and the plasma treatment is stopped.

If no further etching of the subject material 7 is required, high vacuum exhaust ventilation is performed. Then, after static electricity is removed and the subject material 7 is released, the arm of the vacuum transport device moves into the treatment chamber 2 and transports the treated subject material 7 to the outside of the plasma treatment apparatus 1.

<Structure of a Gas Supply Device in a Comparative Example>

Figure 2:
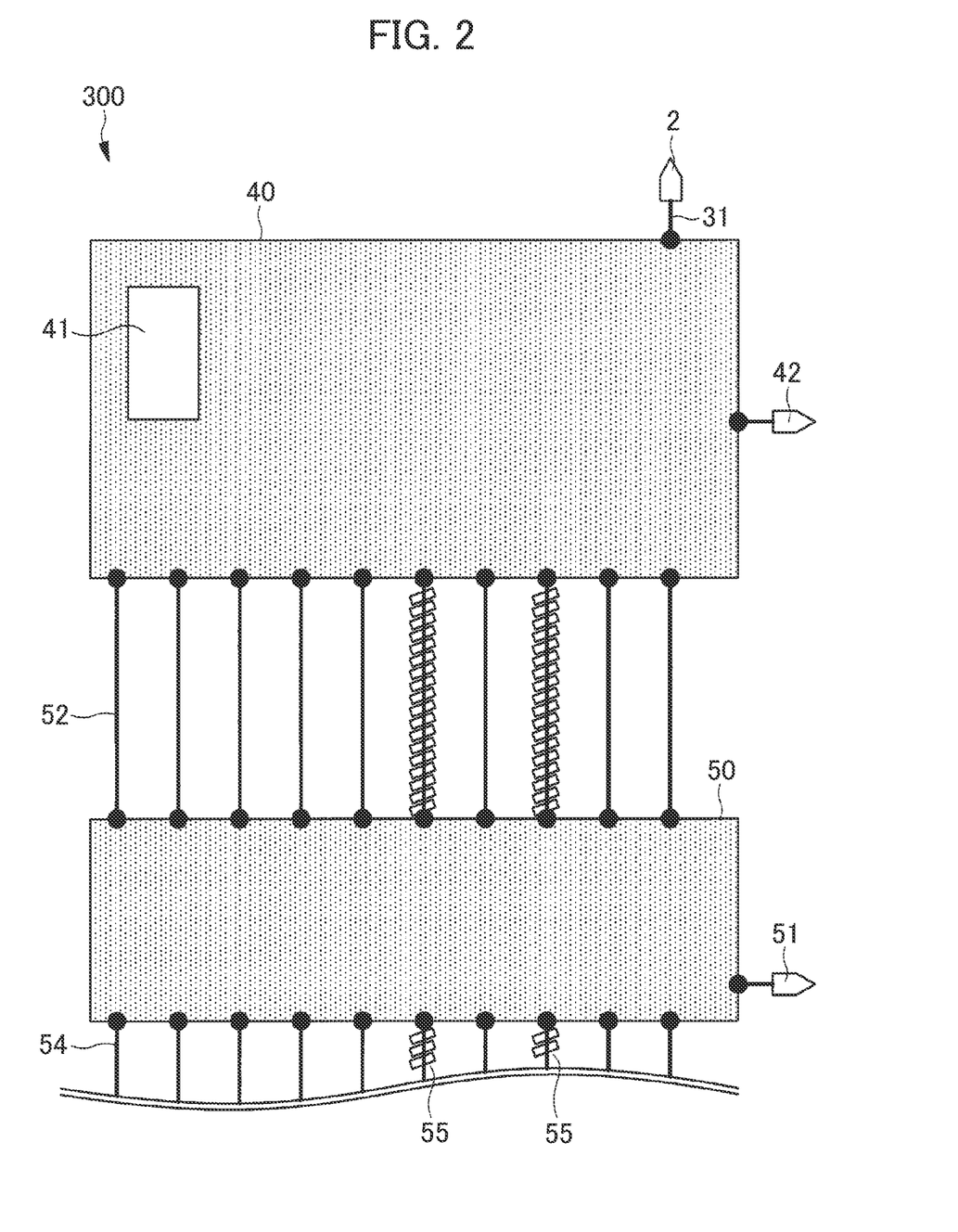
FIG. 2 is a front view of a gas supply device in a comparative example.
Figure 3:
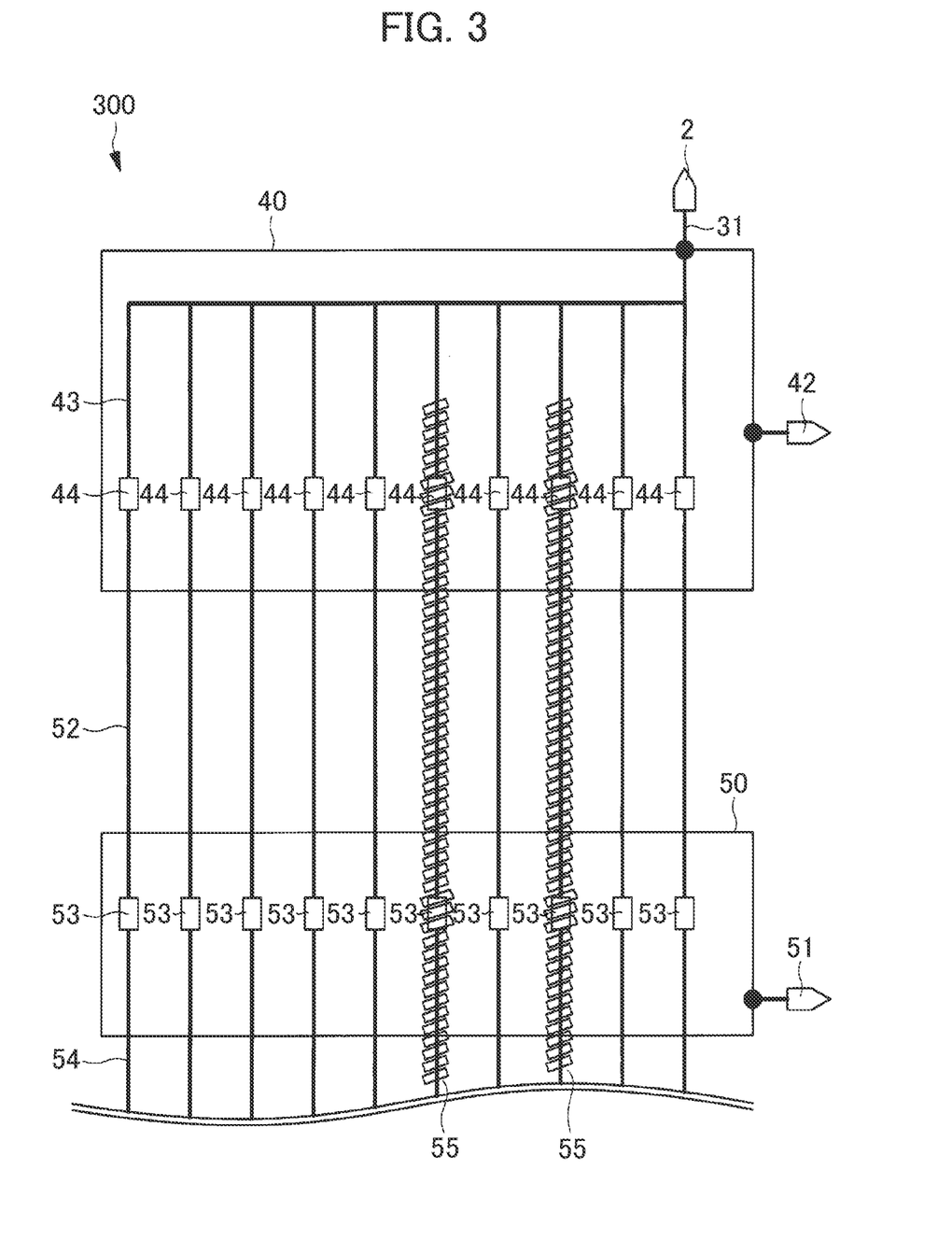
FIG. 3 is a front transparent view that shows the gas supply device in the comparative example.

Next, a gas supply device 300 according to the prior art related to the present invention will be described referring to FIG. 2 and FIG. 3. FIG. 3 shows the pipes provided in each of a mass flow controller box (MFC box) 40 and a gas pipe connection box 50 which are shown in FIG. 2. The gas supply device 300 is different from the gas supply device 30 according to the first embodiment mainly in that it includes the gas pipe connection box 50.

A mass flow controller (MFC) is attached to each of a plurality of pipes 43 provided in the MFC box 40. The plurality of pipes 43 are connected to a plurality of pipes 52 in the MFC box 40 by a plurality of joints 44. A plurality of pipes 54 that serve as supply sources of treatment gas are provided in the building and connected to the plurality of pipes 52 by a plurality of joints 53 in the gas pipe connection box 50. The treatment gas flows in the pipes 54, pipes 52, and pipes 43 and is supplied into the treatment chamber 2 of the plasma treatment apparatus 1 through the pipe 31 which integrates the plurality of pipes 43.

Here, basically the flow rate and pressure of the gas that flows in the pipes are adjusted to prevent gas leakage. However, if an unexpected situation such as an earthquake happens, gas leakage might occur. In particular, gas leakage might occur in the joints 44 and joints 53 at which pipes are connected.

However, the joints 44 are located in the MFC box 40 and the joints 53 are located in the gas pipe connection box 50. Therefore, by constantly discharging the gas in the MFC box 40 to the outside of the building through an exhaust port 42 and constantly discharging the gas in the gas pipe connection box 50 to the outside of the building through an exhaust port 42, the gas can be prevented from diffusing in the building even if gas leakage occurs in the joints 44 and joints 53.

On the other hand, in order to reduce the operating cost of the plasma treatment apparatus 1, omission of exhaust ventilation of the gas pipe connection box 50 is demanded. For this reason, if gas leakage occurs in the joints 53, the gas might diffuse in the building. The gas supply device 30 according to the first embodiment provides a technique that can prevent gas leakage even if exhaust ventilation of the gas pipe connection box 50 is omitted in order to meet the demand.

<Structure of the Gas Supply Device in the First Embodiment>

Next, the gas supply device 30 in the example that the inventors of the present application have examined will be described referring to FIG. 4 to FIG. 8. FIG. 5 shows the pipes that are located in the MFC box 40 shown in FIG. 4.

Figure 4:
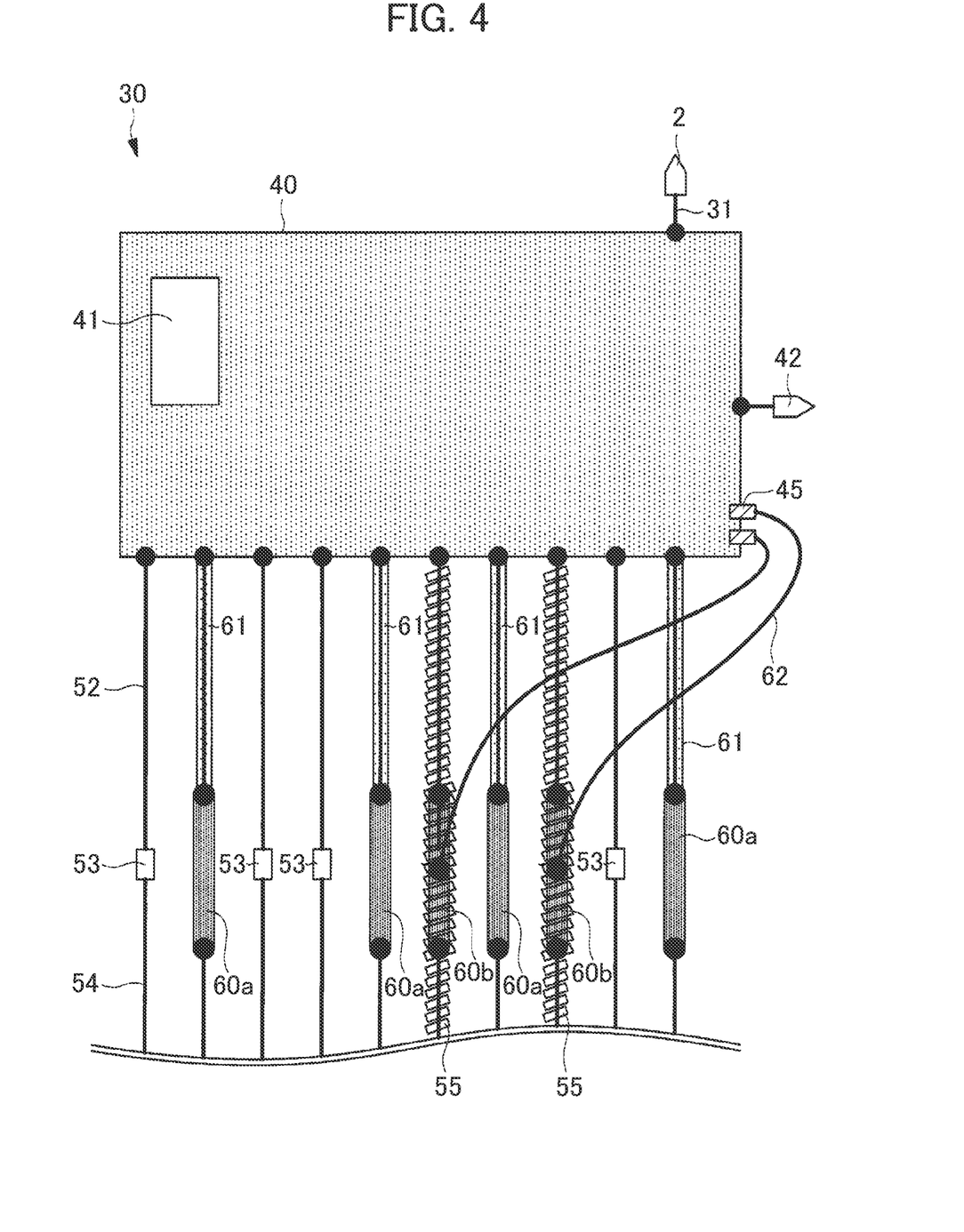
FIG. 4 is a front view that shows a gas supply device in the first embodiment.
Figure 5:
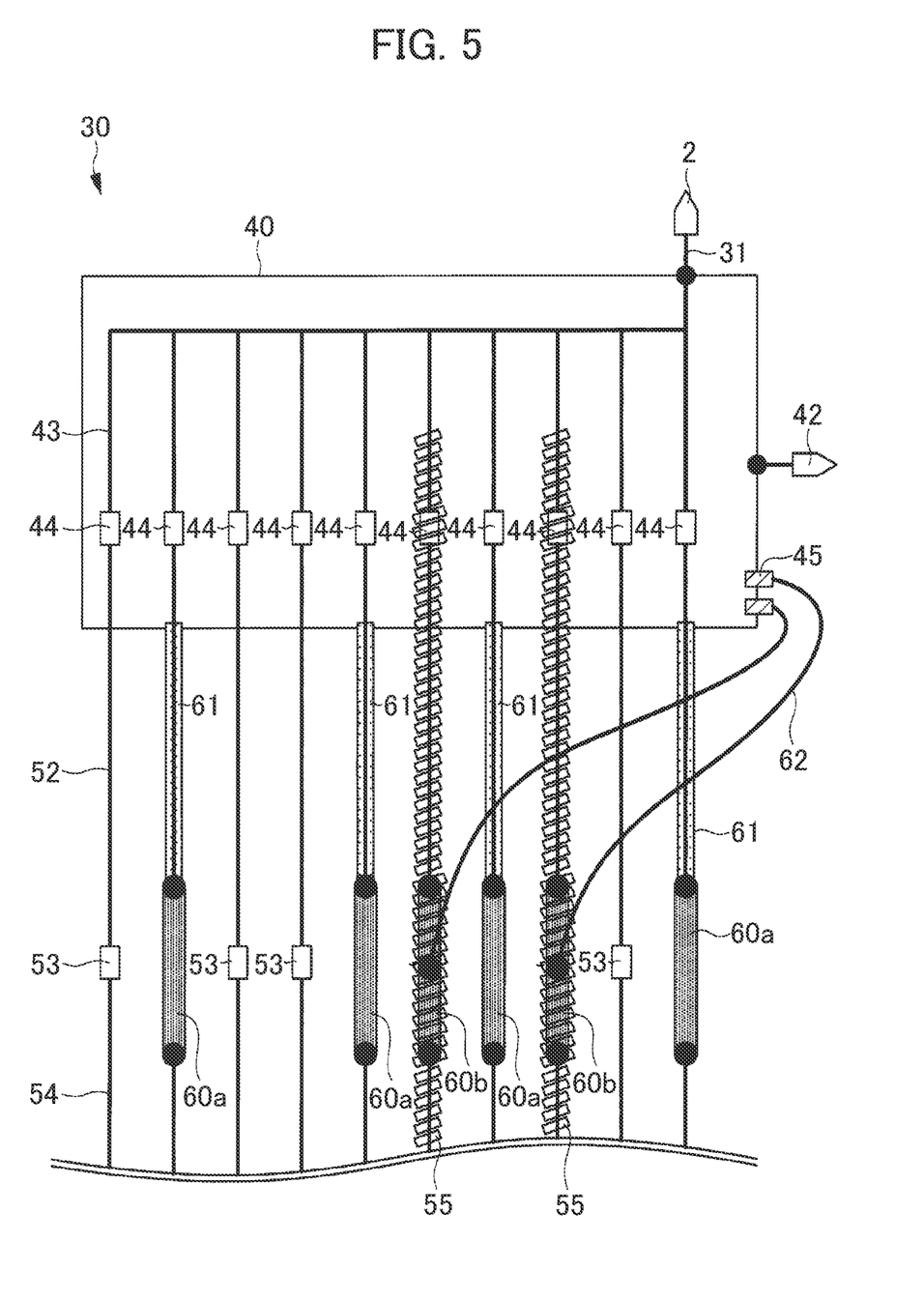
FIG. 5 is a front transparent view that shows the gas supply device in the first embodiment.

As shown in FIG. 4 and FIG. 5, the gas supply device 30 includes an MFC box 40, a plurality of pipes 43, a plurality of joints 44, a plurality of pipes 52, a plurality of joints 53, a plurality of heaters 55, a plurality of pipe covers 60a, a plurality of pipe covers 60b, a plurality of circumferential pipes 61, and a plurality of tubes 62.

The MFC box 40 has an intake port 41 and an exhaust port 42. The exhaust port 42 is connected to a duct line for exhaust such as a pipe (not shown) and communicated and connected to an exhaust mechanism such as an exhaust pump or a gas treatment chamber that is installed under the floor of the building in which the plasma treatment apparatus 1 is installed or outside the building. The exhaust mechanism in the first embodiment is driven all the time. As the mechanism is operated, the gas in the MFC box 40 is discharged by passing from the exhaust port 42 through the duct line connected to the exhaust port 42 and the air as the atmospheric air in the building is sucked through the intake port 41. While the plasma treatment apparatus 1 is operated, the inside of the MFC box 40 is constantly replaced by the atmospheric air in the building through the intake port 41 and exhaust port 42.

Figure 6:
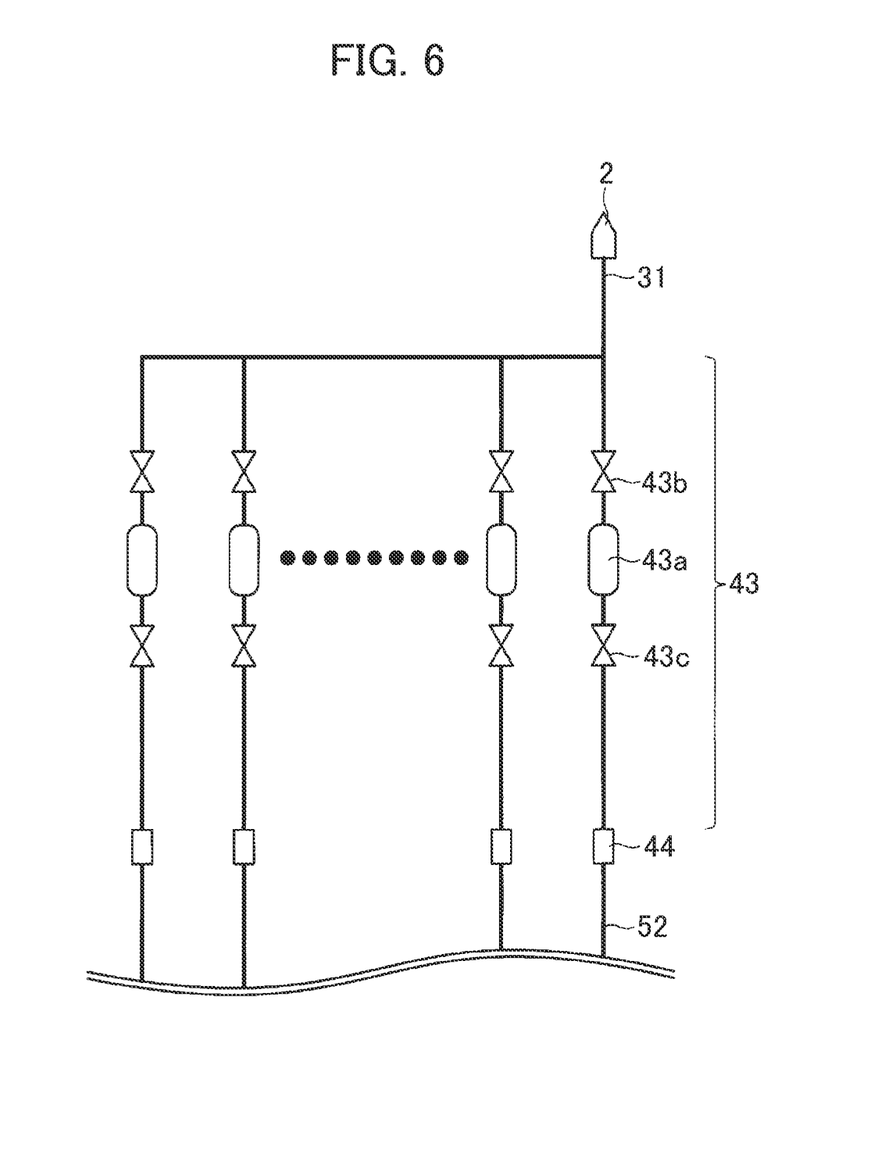
FIG. 6 is a front view that shows pipes including mass flow controllers in the first embodiment.

The pipes 43 are located in the MFC box 40 and integrated into the pipe 31. In addition, as shown in FIG. 6, an MFC 43a, a valve 43b, and a valve 43c are attached to each of the pipes 43. The flow rate of the gas that flows in the pipe 43 is controlled by the MFC 43a. The valve 43b and valve 43c are mainly used to control the start or stop of supply of the gas that flows in the pipe 43. The gas whose flow rate has been controlled in the pipe 43 is supplied into the treatment chamber 2 through the pipe 31.

The MFC 43a, which is relatively large in volume, and the valves 43b and 43c are installed on the pipe 43 in the upper part of the space in the MFC box 40 and the lower portion of the pipe 43 and the joint 44 and pipe 52 connected to it are located in the lower part of the space in the MFC box 40. Furthermore, the exhaust port 42 installed on the right side wall of the MFC box 40 in this example and preferably the intake port 41 are installed at a height position below the valve 43c in the vertical direction of the figure. Therefore, the velocity and flow rate of the atmospheric gas that flows in the MFC box 40 from left to right in the figure are higher in the lower part of the MFC box 40.

The pipes 43 are each connected to one of the pipes 52 by one of the joints 44 in the MFC box 40. The pipes 52 each extend toward the outside of the MFC box 40 in the lower part of the figure and, outside the MFC box 40, connected to one of the pipes 54 extending vertically, by one of the joints 53. The pipes 54 are each connected to a plurality of types of gas sources including a reservoir such as a tank (not shown). Under the floor of the building, there are a plurality of pipes that supply a plurality of types of gas. Each of the pipes 54 is a supply line for the treatment gas to be supplied to the treatment chamber, among the plurality of types of gas. The pipes 54 are each extended from the gas sources to the vicinity of the place where the plasma treatment apparatus 1 is installed.

Regarding the types of treatment gas, each pipe 54 may supply a different type of gas or several pipes 54 may supply the same type of gas. In this example, the treatment gases are roughly classified into three types. The first type of gas is a highly flammable gas or toxic gas and relatively hard-to-liquefy gas. The second type of gas is a highly flammable or toxic gas and relatively easy-to-liquefy gas. In other words, the second type of gas is a gas which has a higher boiling point than the first type of gas. The third type of gas is a gas which has low flammability and no toxicity and is relatively hard to liquefy.

The first type of gas is, for example, $H_2$, $CH_3F$, $CH_4$, $Cl_2$, $SO_2$, HBr, $SiF_4$, $NF_3$ or $CO_2$. The second type of gas is, for example, $SiCl_4$ or $BCl_3$. The third type of gas is, for example, Ar, He, $O_2$, $N_2$, $CHF_3$, $SF_6$ or $CF_4$.

In this example too, when the plasma treatment apparatus 1 has been operated over a prolonged period, gas leakage might occur in the joints 53 due to deterioration in performance, degradation of members or other reason. As explained above in connection with the example of the prior art, because the gas pipe connection box 50 and exhaust ventilation for it are omitted, particularly in the case of a highly flammable or toxic gas (the first type of gas, the second type of gas), if leakage of the gas occurs, diffusion of the gas in the building must be suppressed.

For this reason, in the first embodiment, the pipe covers 60a and 60b, and the circumferential pipe 61 and tube 62 as communicating members are used. In the case of the third type of gas, there is no problem even if leakage occurs and thus for the pipes in which the third type of gas flows, the pipe covers 60a and 60b and the communicating members are not used.

The pipe covers 60a and 60b cover the circumferential sides of the joint 53, pipe 52 and pipe 54. Gaps are made between the pipe covers 60a and 60b, and the joint 53, pipe 52 and pipe 54. The circumferential pipe 61 is connected to the pipe cover 60a at its lower end so that the inside of the pipe cover 60a is communicated with the inside of the MFC box 40. The circumferential pipe 61 extends with the pipe 52 as the center axis and covers the outer circumference of the pipe 52. The tube 62 is connected to the side wall of the pipe cover 60b and connected to the MFC box 40 at a different place from the pipe 52 to form a different gas line from the pipe 52.

Figure 7:
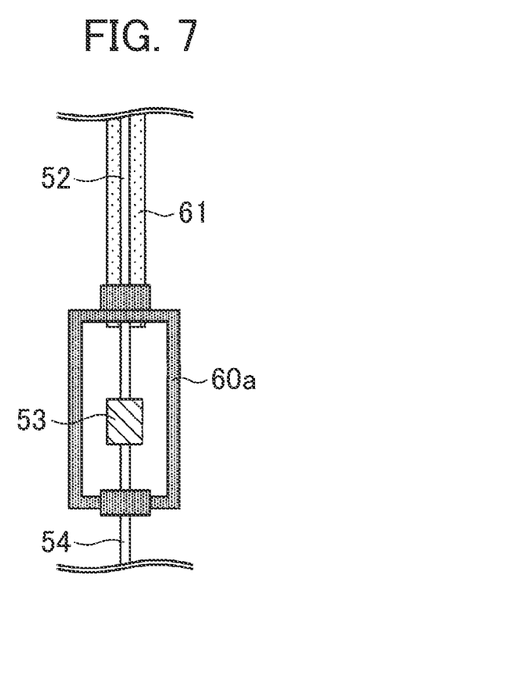
FIG. 7 is a front transparent view that shows a pipe cover and its vicinity in the first embodiment.

FIG. 7 shows details of the pipe cover 60a in FIG. 4 and FIG. 5 and its vicinity and illustrates the case that the circumferential pipe 61 as a communicating member is included. The circumferential pipe 61 is suitable for the case that the first type of gas flows in the pipe 43, pipe 52, and pipe 54.

As shown in FIG. 4 and FIG. 5, at least one of the joints 53 is covered by the pipe cover 60a in a manner that the joint 53 and the space around it are hermetically sealed. The pipe cover 60a has a cylindrical shape longer than the length of the joint 53 in the vertical direction. The pipe cover 60a is made of a metallic material such as stainless steel, iron or copper or an alloy which includes any of these materials as a main component. Furthermore, in order to enhance the airtightness of the pipe cover 60a, among the members constituting the pipe cover 60a, a seal such as packing may be attached to the upper end or lower end portion facing the circumferential wall surfaces of the pipe 52 and pipe 54. Consequently, even if gas leakage from the joint 53 occurs, the gas will remain in the pipe cover 60a.

The circumferential pipe 61 extends with a pipe 52 having a pipe cover 60a, among the plurality of pipes 52, as the center axis and covers that pipe 52. The circumferential pipe 61 is connected to the top of the pipe cover 60a and the bottom of the MFC box 40. The inside of the pipe cover 60a and the inside of the MFC box 40 are communicated through the space between the outer circumferential wall surface of the pipe 52 and the inner circumferential wall surface of the circumferential pipe 61. Consequently, the gas leaked from the connection of the pipe 52 or pipe 54 connected to the joint 53 into the pipe cover 60a diffuses in the gap between the pipe 52 and the circumferential pipe 61 and is introduced into the MFC box 40.

The circumferential pipe 61 is made of a metallic material or resin material. The metallic material is, for example, stainless steel, iron or copper, or an alloy which includes any of these materials as a main component. For example, if the gas to be supplied is a flammable gas, it is assumed that the leaked flammable gas may explode. If the pipe cover 60a is made of the above metallic material with high rigidity, it is easy to prevent breakage or pressure rise due to an impact shock.

The resin material is, for example, epoxy resin. For example, if the supplied gas is less likely to explode but it is a toxic gas, the above resin material, which is relatively inexpensive, may be used in consideration of the material cost.

Figure 8:
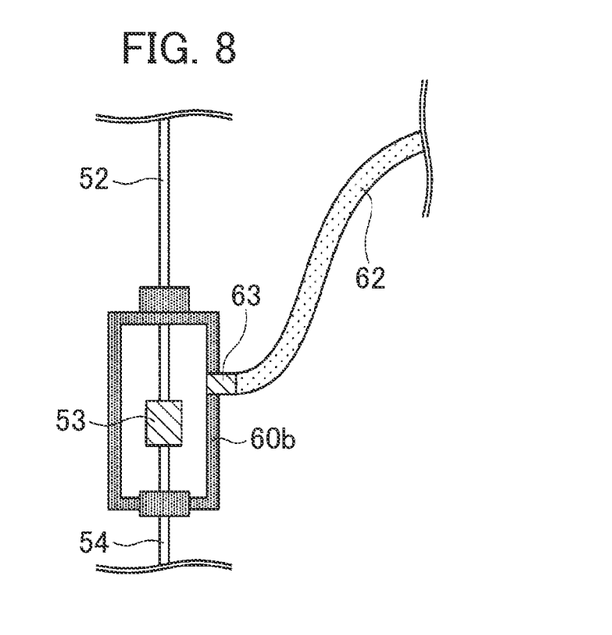
FIG. 8 is a front transparent view that shows a pipe cover and its vicinity in the first embodiment.

FIG. 8 shows details of the pipe cover 60b in FIG. 4 and FIG. 5 and its vicinity and illustrates the case that a tube 62 is included as a communicating member. The tube 62 is suitable for the case that the second type of gas flows in the pipe 43, pipe 52 and pipe 54.

As mentioned above, the second type of gas is relatively easy to liquefy. If the second type of gas like this is supplied from the pipe 54, in order to prevent liquefaction it is effective to install a heater 55 on the circumferences of the pipe 52 and pipe 54. The heater 55 maintains the temperature of the gas flowing in the pipe 43, pipe 52, and pipe 54 at a higher level than the condensation temperature. Here, the heater 55 is a belt-like conductor. By applying an electric current to the conductor, heat is generated from the conductor. The heater 55 is wound spirally in the vertical direction along the circumferences of the pipe 43, pipe 52, and pipe 54 so that the insides of the pipe 43, pipe 52, and pipe 54 can be sufficiently heated.

As in FIG. 7, in FIG. 8 too, at least one of the joints 53 is covered by the pipe cover 60b in a manner that the joint 53 and the space around it are hermetically sealed. The pipe cover 60b has a cylindrical shape longer than the length of the joint 53 in the vertical direction. In order to seal the inside of the pipe cover 60b airtightly, a seal such as an O ring may be installed between the inner circumferential wall surfaces of the opposite upper and lower ends of the pipe cover 60b and the outer circumferential walls of the pipe 52 and pipe 54. In FIG. 8, for illustration simplicity, the heater 55 shown in FIG. 4 and FIG. 5 is omitted. When the heater 55 is required, in some cases it may be difficult to apply the circumferential pipe 61 shown in FIG. 7. In that case, the tube 62 can be used suitably.

The lower end of the tube 62 is airtightly connected to the outer wall surface of the pipe cover 60b through the joint 63. Consequently, the inside of the tube 62 and the inside of the pipe cover 60b are communicated. The upper end of the tube 62 is airtightly connected to the side wall surface of the MFC box 40 under the exhaust port 42 through the joint 45. The inside of the pipe cover 60b and the inside of the MFC box 40 are communicated by the tube 62 in this way. Consequently, the gas that is leaked from the connection of the pipe 52 or pipe 54 connected to the joint 53 into the pipe cover 60b diffuses from the inside of the pipe cover 60b to the inside of the tube 62 and is introduced into the MFC box 40.

The joint 63 is attached to the pipe cover 60b in an attachable and detachable manner and the joint 45 is attached to the MFC box 40 in an attachable and detachable manner. The tube 62 is connected to the pipe cover 60b through the joint 63 and connected to the MFC box 40 through the joint 45. Therefore, the tube 62 is attachable to, and detachable from, the pipe cover 60b and MFC box 40.

The tube 62 is made of a resin material that can transmit visible light. In other words, the tube 62 is made of a material that enables the operator of the plasma treatment apparatus 1 to check the inside of the tube 62 visually. When the leaked gas remaining inside the pipe cover 60b leaves the heater 55, the leaked gas may be liquefied in the tube 62. In that case, if the operator can confirm the liquefied gas visually, it is easier for the operator to find gas leakage from the joint 53 promptly. Thus, it is easier to take some countermeasures against the gas leakage.

As described so far, according to the first embodiment, exhaust ventilation of the gas pipe connection box 50 can be omitted, so the operating cost of the plasma treatment apparatus 1 can be reduced. In addition, even if gas leakage from the joint 53 occurs, the pipe cover 60a, 60b and the communicating member (circumferential pipe 61, tube 62) can introduce the leaked gas into the MFC box 40 and the leaked gas can be discharged from the exhaust port 42 of the MFC box 40 to the outside of the building. More specifically, according to the first embodiment, it is possible to provide a plasma treatment apparatus 1 with a gas supply device 30 that can prevent gas leakage.

The present invention has been so far described concretely in reference to the above embodiment. However, the present invention is not limited to the above embodiment and these details may be modified in various ways without departing from the gist thereof.

For example, the communicating member is exemplified by the circumferential pipe 61 and tube 62, but the communicating member may be another type of member, provided that it enables the inside of the MFC box 40 and the inside of the piper cover 60a, 60b to be communicated.

Furthermore, in the above embodiment, the case that the pipe cover 60a, 60b and the above communicating member are not used for the pipe in which the third type of gas flows has been given as an example, but the pipe cover 60a, 60b or the above communicating member or both of them may be used for that type of pipe too.

LIST OF REFERENCE SIGNS 1 plasma treatment apparatus
2 treatment chamber
3 stage
4 window member
plate
6 through hole
7 subject material (wafer)
8 impedance matching box
9 high frequency power source
10 waveguide
11 magnetron oscillator
12 solenoid coil
13 solenoid coil
14 pressure adjusting plate
15 pressure detector
16 turbo-molecular pump
17 dry pump
18 exhaust pipe
19-21 valve
30 gas supply device
31 pipe
40 mass flow controller box (MFC box)
41 intake port
42 exhaust port
43 pipe
43a mass flow controller (MFC)
43b, 43c valve
44, 45 joint
50 gas pipe connection box
51 exhaust port
52 pipe
53 joint
54 pipe
55 heater
60b pipe cover
61 circumferential pipe
62 tube
63 joint
300 gas supply device

The invention claimed is:

1. A plasma treatment apparatus comprising a treatment chamber and a gas supply device for supplying a treatment gas into the treatment chamber,
   the gas supply device comprising:
   a mass flow controller box having an intake port and an exhaust port;
   a plurality of first pipes which are located in the mass flow controller box and to each of which a mass flow controller is attached; and
   a plurality of second pipes which are connected to the plurality of first pipes in the mass flow controller box and connected to a plurality of third pipes as supply sources of the treatment gas by a plurality of first joints outside the mass flow controller box, wherein
   at least one of the first joints is covered by a first pipe cover so that the first joint is hermetically sealed, and
   an inside of the first pipe cover and an inside of the mass flow controller box are communicated by a first communicating member.

2. The plasma treatment apparatus according to claim 1, wherein
   the first communicating member includes a circumferential pipe covering a circumference of the second pipe provided with the first pipe cover, among the second pipes.

3. The plasma treatment apparatus according to claim 2, wherein
the circumferential pipe is made of a metallic material.

4. The plasma treatment apparatus according to claim 2, wherein
the circumferential pipe is made of a resin material.

5. The plasma treatment apparatus according to claim 1, wherein
the first communicating member includes a tube which is connected to the first pipe cover and the mass flow controller box in an attachable and detachable manner.

6. The plasma treatment apparatus according to claim 5, wherein
the tube is made of a resin material which can transmit visible light.

7. The plasma treatment apparatus according to claim 2, wherein
at least one of the first joints is covered by a second pipe cover so that the first joint is hermetically sealed,
an inside of the second pipe cover and the inside of the mass flow controller box are communicated by a second communicating member,
the second communicating member includes a tube which is connected to the second pipe cover and the mass flow controller box in an attachable and detachable manner, and
the treatment gas to flow in the first pipe, the second pipe, and the third pipe to which the second communicating member is applied is a gas having a higher boiling point than the treatment gas to flow in the first pipe, the second pipe, and the third pipe to which the first communicating member is applied.

8. The plasma treatment apparatus according to claim 7, wherein
the treatment gas to flow in the first pipe, the second pipe, and the third pipe to which the first communicating member is applied is $H_2$, $CH_3F$, $CH_4$, $Cl_2$, $SO_2$, HBr, $SiF_4$, $NF_3$ or $CO_2$,
the treatment gas to flow in the first pipe, the second pipe, and the third pipe to which the second communicating member is applied is $SiCl_4$ or $BCl_3$, and
the treatment gas to flow in the first pipe, the second pipe, and the third pipe to which the first communicating member or the second communicating member is not applied is Ar, He, $O_2$, $N_2$, $CHF_3$, $SF_6$ or $CF_4$.

9. The plasma treatment apparatus according to claim 7, wherein
a heater is provided on circumferences of the first pipe, the second pipe, and the third pipe to which the second communicating member is applied.

* * * * *